(12) United States Patent
Beranger

(10) Patent No.: US 7,378,843 B2
(45) Date of Patent: May 27, 2008

(54) PULSED EXCITATION AND SAMPLED DETECTION FLUXGATE TYPE MAGNETOMETER

(75) Inventor: Marc Beranger, Saint Martin d'Uriage (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 11/626,694

(22) Filed: Jan. 24, 2007

(65) Prior Publication Data

US 2007/0170916 A1    Jul. 26, 2007

(30) Foreign Application Priority Data

Jan. 26, 2006  (FR) .................................. 06 50280

(51) Int. Cl.
G01R 33/02 (2006.01)
G01R 33/04 (2006.01)
(52) U.S. Cl. ........................ 324/253; 324/244
(58) Field of Classification Search ............... 324/253, 324/244, 249, 254, 255; 33/355 R, 356
See application file for complete search history.

(56) References Cited

U.S. PATENT DOCUMENTS

| 3,435,337 A | 3/1969 | Inouye et al. |
| 3,638,074 A | 1/1972 | Inouye |
| 4,495,467 A | 1/1985 | Kuno et al. |
| 5,537,038 A * | 7/1996 | Ando ........................ 324/253 |
| 5,744,956 A | 4/1998 | Hawks |
| 2004/0201379 A1 | 10/2004 | Guilhamat et al. |

FOREIGN PATENT DOCUMENTS

FR    2 828 740    2/2003

OTHER PUBLICATIONS

Pavel Ripka, et al., "Pulse Excitation of the Micro-fluxgate Sensors", Oct. 12, 2000, pp. 1-5.

* cited by examiner

Primary Examiner—Patrick Assouad
Assistant Examiner—David M. Schindler
(74) Attorney, Agent, or Firm—Oblon, Spivak, McClelland, Maier & Neustadt, P.C.

(57) ABSTRACT

A magnetic field measuring device, equipped with a fluxgate magnetometer, the device including a magnetic sensor equipped with at least one magnetic core and a plurality of windings, and configured to deliver at least one output signal, pulse generating means for emitting at least one excitation signal at the input of the magnetic sensor, in the form of a succession of excitation pulses, one excitation pulse of the excitation pulses having a duration at least 50 times less than a period of the at least one excitation signal, sampling means for sampling the output signal of the magnetic sensor, and means for, following the emission of at least one excitation pulse of the succession of excitation pulses and during the duration of the at least one excitation pulse, triggering at least one acquisition of the output signal of the magnetic sensor by the sampling means.

35 Claims, 12 Drawing Sheets

PULSED EXCITATION AND SAMPLED DETECTION FLUXGATE TYPE MAGNETOMETER

TECHNICAL FIELD

The present invention relates to the field of magnetometers or magnetic sensors, and employs an electronic or microelectronic magnetic field detection or/and measuring device, comprising a fluxgate type magnetometer magnetic sensor, as well as improved means of pulsed excitation of the sensor and sampled detection at the output of the sensor. The invention further concerns an improved method of detection or/and measuring by means of such a device.

The device and method according to the invention bring improvements, particularly in terms of signal to noise ratio, consumption and bandwidth.

STATE OF THE PRIOR ART

"Fluxgate" type magnetometers find use in measuring magnetic fields, which may be weak or even very weak, for example of around one microtesla with a resolution of around one nanotesla or even around several picoteslas, depending on the dimensions of the magnetometer. Magnetometers can be applied to the field of microelectronics and be incorporated in integrated circuits. These magnetometers are then manufactured by means of techniques of forming thin films.

An electronic or microelectronic device comprising a "fluxgate" type magnetometer is conventionally equipped: with a sensor, excitation means or an excitation circuit capable of delivering a periodic excitation signal to the sensor, and detection means or a detection circuit at the output of the sensor. The sensor generally comprises a magnetic circuit or magnetic core, as well as one or several windings responsible for the excitation of the magnetic circuit and one or several "reception" or "detection" windings responsible for the measurement. These elements function in collaboration.

The excitation signal delivered to the sensor is generally sinusoidal or triangular as in FIG. 1A. This excitation signal periodically saturates the magnetic circuit of the sensor, under a magnetic induction alternately positive and negative. Due to the non-linearity of the magnetising curve of the magnetic material forming the core, the signal induced at the terminals of the detection windings essentially comprises odd harmonic components of the frequency of excitation (FIGS. 1B, 1C, 1D illustrate respectively, a magnetising curve of the core, an induction curve in the magnetic material of the core, as well as an induced voltage signal). In the presence of an external magnetic field, the hysterisis cycle of the magnetic material is no longer symmetrical and one observes even harmonics of the frequency of excitation.

An example of a magnetic field measuring device according to the prior art equipped with a fluxgate magnetometer, is illustrated in FIG. 2. This device comprises a sensor 10 equipped with a magnetic circuit comprising a magnetic core 12. Means of exciting the core 12 are provided at the input of the magnetic circuit and comprise a current generator 20 capable of delivering an excitation signal of the type of that illustrated in relation to FIG. 1A, the frequency $f_0$ of the excitation signal being imposed by a clock circuit or a clock 22. The current generator 20 is connected to two excitation windings 13 and 14. The magnetic circuit 10 further comprises two detection windings 15 and 16 wired in opposition so that the even harmonic components add to each other and the odd harmonic components subtract from each other. From the signal at the output of the sensor, one extracts a signal known as "useful" by means of a preamplifier and a band pass filter (block referenced 30 in FIG. 2) situated at the output of the two detection windings 15 and 16 and a synchronous detection circuit 32 situated after the band pass filter. The synchronous detection circuit 30 carries out a detection of the useful signal at a frequency that may be around, or equal to, $2*f_0$. This frequency $2*f_0$ known as "detection" frequency, may be imposed on the synchronous detection circuit 32, through the intermediary of a phase changer 25 situated at the output of the clock 22. At the output of the synchronous detection circuit 30 a low pass filter 34 may also be provided. The device may if necessary nave a slaved operating. In this case, the signal at the output of the synchronous detection circuit serves as an error signal for a servo loop.

For a micro-fluxgate magnetometer, the wave shape, the amplitude, the frequency, the phase between the excitation signal and the synchronous detection are parameters independent of each other, which restricts the suitability of the device to a single operating frequency.

With such a device as described previously, one generally observe a significant noise in the useful signal during phases of saturation and de-saturation of the magnetic circuit 10. FIG. 3A illustrates in such type of device a signal 40 at the output of the sensor 10 in response to an excitation signal 42 of frequency around 200 kHz, without the magnetic circuit of the sensor being subjected to an external field. One observes that the output signal 40 from the sensor 10 comprises a significant noise 44 during the saturation and the de-saturation of the magnetic circuit. FIG. 3B illustrates, for its part, an output signal 46 from the magnetic circuit 10, in response to an excitation signal 48 of frequency around 1 MHz, without the magnetic circuit 10 being subjected to an external field. The output signal 46 also comprises a significant noise 50.

FIG. 3C illustrates for its part signals 62, 66, at the output of the sensor 10, for a triangular excitation signal 60 of frequency around 1 MHz. In the presence of an external magnetic field of +15 µT, one may observe in such a device, a useful signal 62 comprising positive alternations 63 then negative alternations 64 at each saturation of the magnetic circuit, twice per period of the excitation signal 60. In the presence of a magnetic field of −15 µT, a useful signal 66 comprising negative alternations then positive alternations, twice per period of the excitation signal. The phase between the excitation signal 60 and the synchronous detection means must be perfectly adjusted but the sensor induces a phase difference dependent on the frequency, the amplitude of excitation and the temperature. This phase problem is the reason for offsets and the phenomenon of the very low frequency noise in the useful signal.

For a synchronous detection fluxgate magnetometer, the origin of the signal that one detects is the non linearity of the magnetising curve of the magnetic material. This non-linearity shows all of the even harmonics 69 of the excitation signal 60. For a device equipped with a synchronous detection 32 such as described previously, only the harmonic of rank 2 of the signal 70 at the output of the magnetic circuit 10 is exploited. The harmonics of superior ranks are rejected by the low pass filter 34 (FIG. 3D)

In a general manner, when a fluxgate magnetometer is combined with excitation means delivering a triangular or sinusoidal signal, and/or combined with a synchronous detection circuit, instabilities or phenomena of bistability appear. This default takes the form of jumps or offsets in the signal at the output of the magnetic sensor.

The document FR 01 10853 describes a solution for reducing offset phenomena, and in particular a method for stabilising a magnetometer equipped with a magnetic core, windings of which at least one active winding and one receiver winding, the active winding being laid out so as to create an excitation magnetic field in the core, which sensitises the receiver winding, means for passing from an alternating current to an excitation frequency in the active winding and means of measuring a voltage induced at a frequency double the frequency of excitation in the receiver winding. This method comprises at least one step consisting in subjecting the receiver winding to a supplementary alternating magnetic field.

The document "Pulse Excitation of the Micro-fluxgate Sensors", Pavel Ripka and al., Oct. 12, 2000) describes for its part, a variant of a magnetic field measuring device comprising a fluxgate magnetometer as well as a current generator delivering a square signal of cyclic ratio around 20% at the input of the magnetic circuit of the magnetometer. The detection of a signal at the output of the magnetic circuit is achieved by means of a synchronous detection circuit of type "SR844 lock in amplifier" of the Stanford Research Systems company. Such a device enables improved performances to be obtained particularly in terms of consumption, but has offset shifts and very low frequency noise such as described previously.

The problem is posed of finding a new electronic or microelectronic device comprising a fluxgate magnetometer, the performances of which are improved in terms of signal to noise ratio, consumption and bandwidth.

DESCRIPTION OF THE INVENTION

The aim of the present invention is to describe a magnetic field measuring device equipped with at least one fluxgate magnetometer, and comprising improved means of excitation of the sensor or magnetic circuit of the magnetometer, as well as improved means of detection of the signal or signals at the output of said sensor or said magnetic circuit.

The invention firstly concerns a magnetic field measuring device equipped with a fluxgate magnetometer, the device comprising:
  a magnetic sensor equipped with at least one magnetic core and a plurality of windings, and capable of delivering at least one output signal,
  pulse generating means capable of emitting at least one excitation signal at the input of the magnetic sensor, in the form of a succession of pulses known as "excitation" pulses,
  means of sampling the output signal of the magnetic sensor,
  the device further comprising means, for example pulse generating means for, following the emission of at least one given excitation pulse of said succession of excitation pulses and during the duration of said given excitation pulse, triggering at least one acquisition of the output signal of the magnetic sensor by said sampling means.

The device according to the invention may be a microelectronic device.

A "sampled" detection exploits the peak to peak amplitude of the output signal of the sensor and makes it possible, unlike a conventional synchronous detection, to exploit all the harmonics of this output signal.

According to one specific embodiment, the device may comprise means for: triggering at least one acquisition of the output signal of the magnetic circuit during the respective durations of each of said pulses of said succession of pulses.

Such a device may if necessary comprise pulse generating means combined with several multiplexed magnetic sensors, the sensors each being combined with sampled or sampling detection means.

Such a device has an improved signal to noise ratio and consumption compared to devices according to the prior art, and in particular compared to those comprising synchronous detection means at the output of the magnetic sensor.

In a device according to the invention, the phenomena of instability or bi-stability are also reduced compared to the devices according to the prior art.

With such a device, the bandwidth is also adjustable by the frequency of said excitation signal.

According to one possibility, the excitation signal may comprise or be formed of successive excitation pulses of opposite signs. This may make it possible to limit the offset phenomena of the signal at the output of the sensor.

According to one possibility, which may be combined with the previous possibility, said excitation pulses may also have equal respective durations or/and respective amplitudes.

According to another possibility, which may be combined with the previous ones, said pulses may further have a rectangular shape.

The excitation signal is preferably formed of short pulses.

The sampled or sampling detection means may be controlled by at least one control signal with two states, generated by the generating means.

According to a first embodiment, the sampling means may be provided, following said emission of said given pulse, to carry out an acquisition of the output signal of the sensor during a given time interval less than the duration of said given pulse, said time interval being between an instant situated at a predetermined time frame, preferably not zero, after the start of said pulse and an instant situated at another predetermined time frame, preferably not zero, before the end of said given pulse. This may make it possible to carry out an acquisition of the signal at an instant when electromagnetic, capacitive or/and inductive coupling phenomena are minimised or non-existent.

According to this first embodiment, the sampling means may be further provided to carry out an averaging or a smoothing out of the output signal of the magnetic sensor during said given time interval.

A signal known as "smoothed out" may be formed following said averaging or said smoothing out of the output signal. According to his first embodiment, the sampling means may be capable, moreover, of memorising said "smoothed out" signal, after said given time interval and up to at least one other pulse of said succession of pulses.

According to this first embodiment, the sampling means may comprise means forming a switch, for example analog.

According to this first embodiment, the sampling means may further comprise means forming a low pass filter.

According to one embodiment, the sampling means may be provided to: following said emission of said given excitation pulse, carry out at least one acquisition of the output signal of the sensor at a given predetermined instant situated after the start and before the end of said given excitation pulse.

The proximity of the excitation and detection windings may lead to an electromagnetic coupling that does not comprise a useful signal.

Said given predetermined instant may be situated in the middle of said given excitation pulse. This may make it possible to carry out an acquisition of the signal at an instant when electromagnetic, capacitive or/and inductive coupling phenomena are minimised or non-existent.

According to the second embodiment, the sampling means may be provided to carry out a memorization of the output signal of the sensor at said given predetermined instant.

According to the second embodiment, the sampling means may comprise at least one sampler-blocker.

According to one variant, the sampling means may be further capable, following the emission of a pulse, of carrying out an analog to digital conversion of the output signal of the circuit as of or at said given predetermined instant. The sampling means may comprise means forming an analog to digital converter.

According to one embodiment of the measuring device, this device is capable of slaved operating and may comprise one or several feedback windings, and a feedback loop equipped with means for producing a feedback signal intended for said feedback windings.

Said means for producing a feedback signal may comprise means forming at least one integrator.

Said means for producing a feedback signal may comprise means for memorising an information relative to the amplitude of said feedback signal between two excitation pulses.

According to one embodiment of the device, the means for producing a feedback signal may be controlled by at least one feedback control signal generated by the pulse generating means in the form of a succession of pulses known as "feedback control" pulses.

According to this embodiment, the variations in the feedback control signal may be dependent on the variations in the excitation signal, the variations in the sampling control signal themselves being dependent on the variations in the excitation signal.

According to one possibility, the measuring device according to the invention may further comprise: means for, following a variation according to a given rapidity, of the magnetic field in which the magnetic sensor is bathed, modulating the frequency of repetition of said pulses of the excitation signal as a function of said given rapidity of variation.

The invention further concerns a magnetic field measuring method by means of a device equipped with a fluxgate magnetometer, the device comprising:
 a magnetic circuit or magnetic sensor, equipped with at least one magnetic core, and capable of delivering at least one output signal,
 means of exciting the magnetic core, comprising generating means capable of emitting an excitation signal at the input of the magnetic circuit or the magnetic sensor in the form of a succession of pulses known as "excitation" pulses,
 means of sampling the output signal of the magnetic circuit, the method comprising the steps consisting in:
 emitting at least one "excitation" pulse at the input of the sensor,
 triggering, following said pulse, at least one acquisition of the output signal of the magnetic sensor by the sampling means during the duration of said pulse.

According to one specific embodiment, the method may comprise the steps consisting in:
 emitting a succession of "excitation" pulses,
 triggering, following each of said "excitation" pulses, at least one acquisition of the output signal of the sensor or magnetic circuit by the sampling means throughout the respective durations of these "excitation" pulses.

The excitation signal may be formed of successive "excitation" pulses of respective opposite signs.

Said "excitation" pulses, may have equal respective durations or/and respective amplitudes.

Said "excitation" pulses, may have a rectangular shape.

The sampling means may be controlled by at least one sampling control signal with two states, generated by said generating means.

According to a first embodiment of the method, said method may further comprise: following said emission of said "excitation" pulse, at least one acquisition of the output signal of the sensor during a given time interval less than the duration of said "excitation" pulse, said time interval being between an instant situated at a predetermined time frame after the start of said pulse and an instant situated at another predetermined time frame before the end of said "excitation" pulse.

According to this first embodiment, the method may comprise a step consisting in carrying out an averaging or a smoothing out of the output signal of the circuit or magnetic sensor during said given time interval.

According to a second possibility of embodying the method, said method may comprise, following said emission of said "excitation" pulse, at least one acquisition of the output signal of the sensor at a given predetermined instant situated after the start and before the end of said "excitation" pulse, for example an instant situated in the middle of said "excitation" pulse.

According to said second embodiment possibility, the method may further comprise: a memorisation of the output signal of the circuit at said predetermined instant.

According to said second embodiment possibility, the method may further comprise: following the emission of a pulse, an analog to digital conversion of the output signal of the circuit at said given predetermined instant.

According to one embodiment possibility, the device may further comprise: one or several feedback windings, and a feedback loop equipped with means for producing a feedback signal intended for said feedback windings, and in which the means for producing said feedback signal are controlled by at least one feedback control signal generated by the pulse generating means in the form of a succession of pulses known as "feedback control" pulses, said excitation pulse emitted at the step a) of the method may have been triggered following an emission by the pulse generating means, of a "feedback control" pulse.

The steps a) and b) may take place during the duration of said "feedback control" pulse.

According to one embodiment possibility, the method may further comprise, following a variation in the magnetic field in which the magnetic sensor is bathed according to a given rapidity of variation, a step of: modulation of the frequency of repetition of said pulses of the excitation signal as a function of the given rapidity of variation.

BRIEF DESCRIPTION OF DRAWINGS

The present invention will be more fully understood on reading the description of embodiments given, purely by way of indication and in nowise limitative, and by referring to the appended drawings in which.

Identical, similar or equivalent parts of the different figures bear the same numerical references so as to facilitate passing from one figure to the next.

The different parts represented in the figures are not necessarily represented according to a uniform scale, in order to make the figures more legible.

DETAILED DESCRIPTION OF SPECIFIC EMBODIMENTS

Figure 1A:
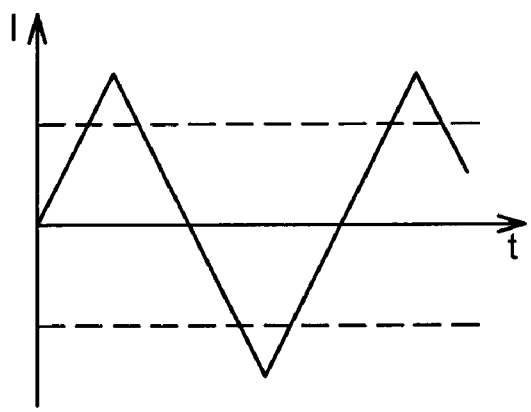
FIGS. 1A-1D illustrate different signals representative of the operation of a magnetic field measuring device equipped with a fluxgate magnetometer, and employed according to the prior art.
Figure 1B:
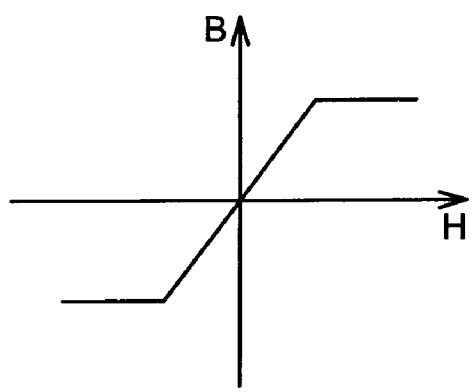
Figure 1C:
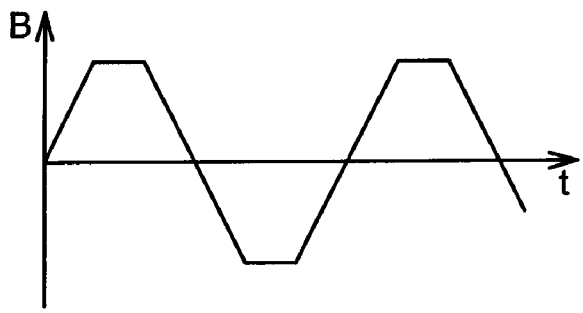
Figure 1D:
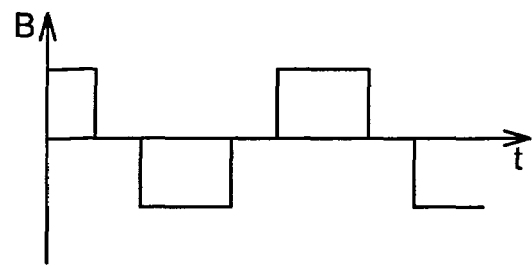
Figure 2:
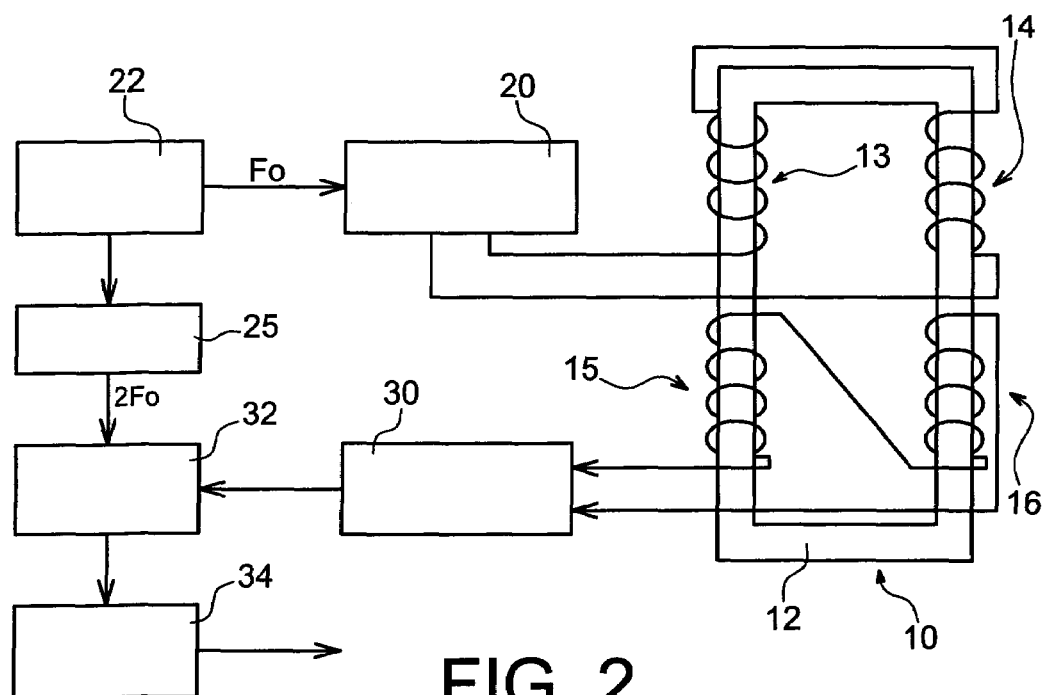
FIG. 2 illustrates an example of magnetic field measuring device according to the prior art, equipped with a fluxgate magnetometer.
Figure 3A:
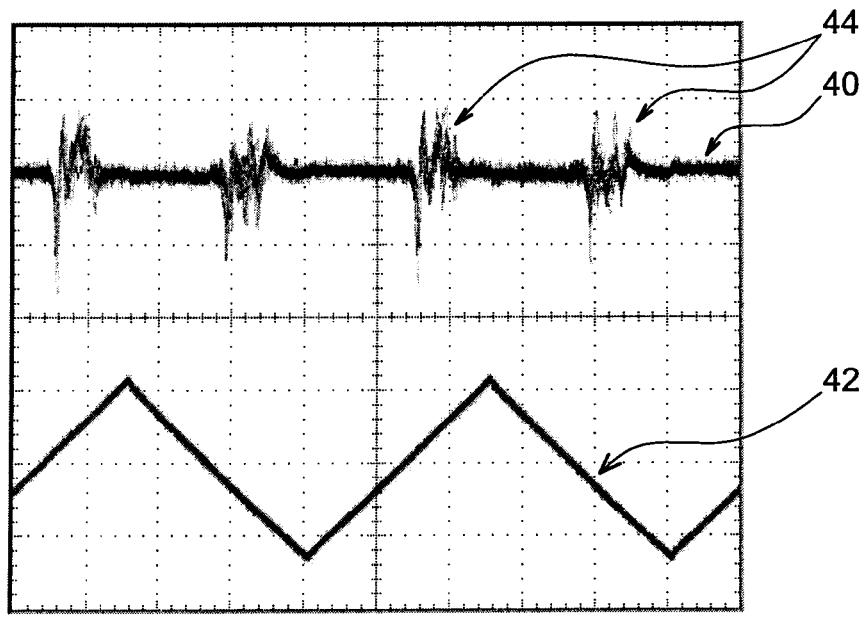
FIGS. 3A-3D illustrate excitation signals emitted at the input, of a fluxgate magnetometer integrated in a magnetic field measuring device according to the prior art and output signals from the magnetometer.
Figure 3B:
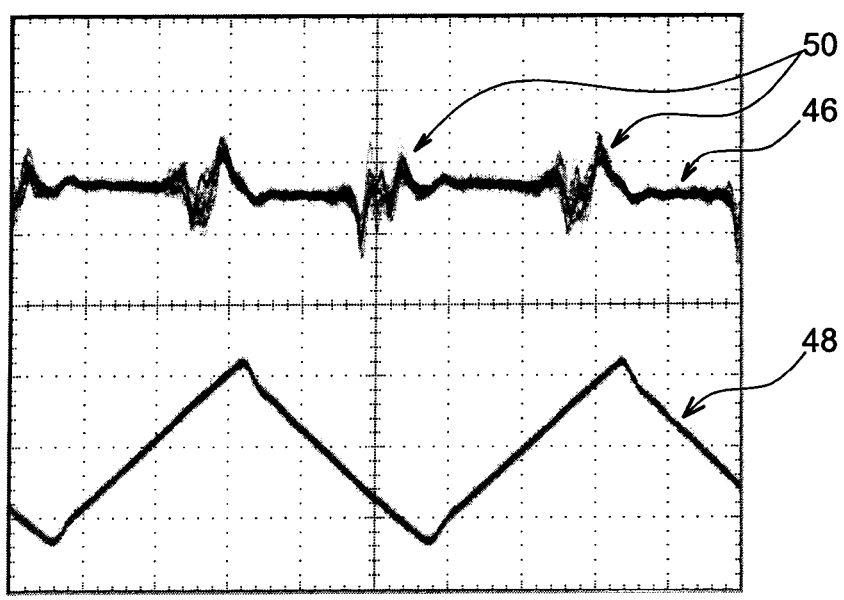
Figure 3C:
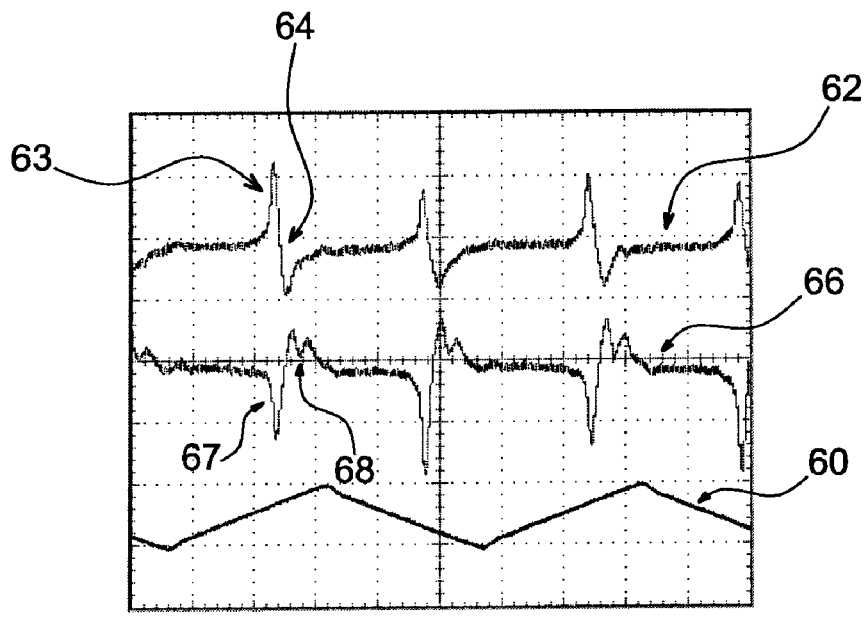
Figure 3D:
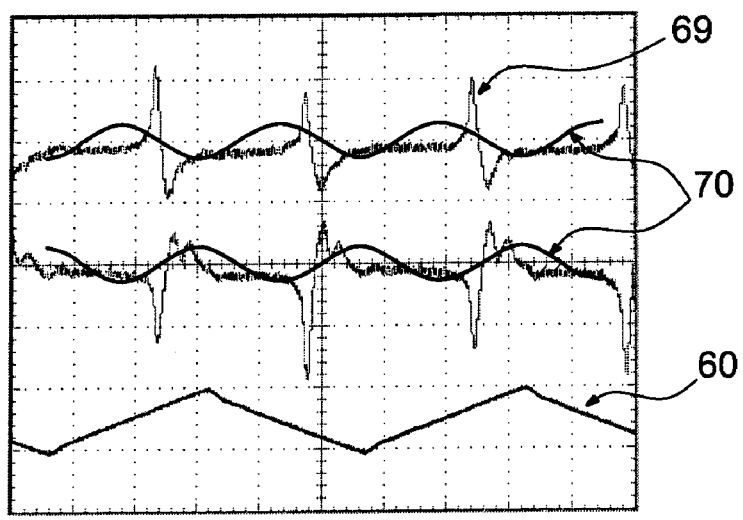
Figure 4:
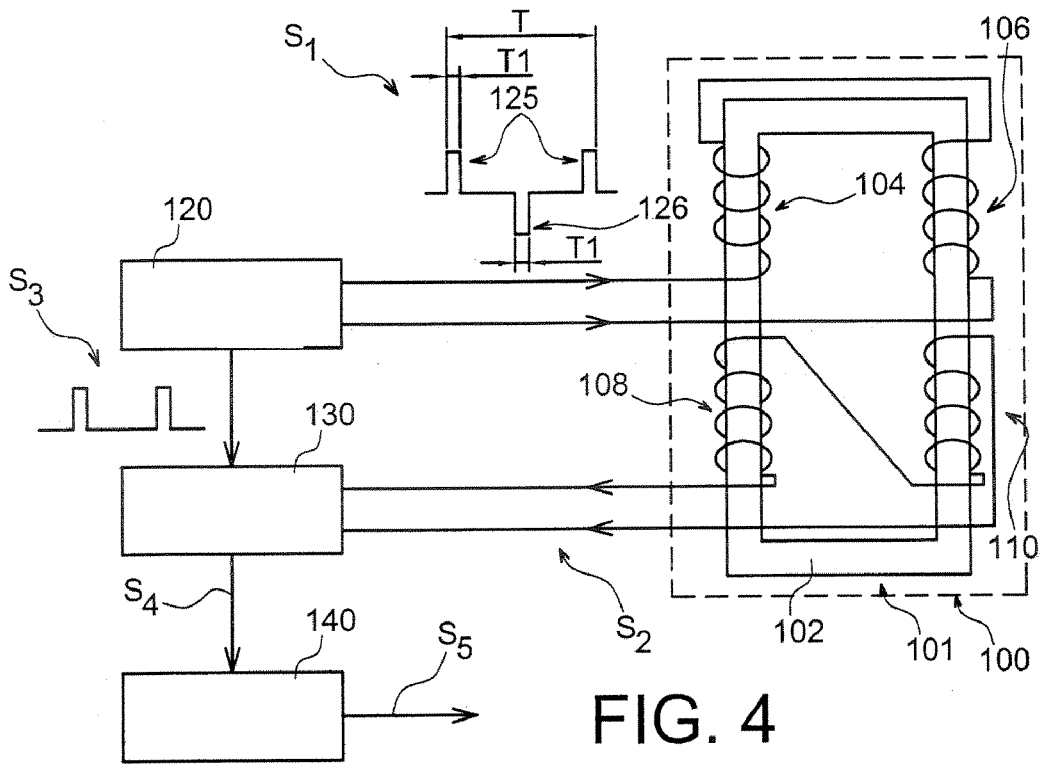
FIG. 4 illustrates a magnetic field measuring device according to the invention, comprising fluxgate magnetometer type sensor, pulsed excitation means, and improved sampling or detection means at the output of the sensor.

An example of electronic detection or/and measuring device according to the invention, comprising a magnetometer type sensor 100, is illustrated in FIG. 4. The sensor 100 may be in particular a fluxgate, or microfluxgate or integrated fluxgate sensor, in other words a fluxgate magnetometer included in a microelectronic device such as a MEMS (MEMS for micro electromechanical system) or a chip. The electronic detection device further comprises means of excitation or an excitation circuit at the input of the sensor 100, and detection means or a detection circuit at the output of the sensor 100. The magnetic sensor is formed of a magnetic circuit 101 equipped with a magnetic core 102. The magnetic circuit 101 may have a high magnetic permeability, for example between 500 and 2000, for a magnetic core based on Iron/Nickel. The magnetic core 102 may be closed. The invention may also apply to magnetic cores having other shapes to that illustrated in FIG. 4, and if necessary to a magnetic circuit comprising an open core. In the case of a micro-fluxgate or integrated fluxgate, the magnetic circuit may for example have a thickness of around one or several micrometers.

One or several excitation windings are provided to saturate the magnetic core 102. The device may comprise for example a first excitation winding 104 and a second excitation winding 106, connected in series and wound around branches of the core 102. The excitation windings 104 and 106 are arranged so as to create an excitation magnetic field in the magnetic core 102. The device may comprise a first and a second detection winding noted respectively 108 and 110 also each wound around the core 102 of the magnetic circuit. The magnetic core 102 may be orientated for example according to the axis known as "easy magnetisation" or along the axis known as "difficult magnetisation".

The number of detection and excitation windings of the magnetometer according to the invention, as well as the layout of these windings is in no way restricted to that which is illustrated in FIG. 4. According to a variant embodiment of the device, the core of the magnetic circuit may be formed of several distinct or/and disjointed branches, for example of two branches each comprising an excitation winding and a detection winding. This variant may enable the windings to be connected according to a differential assembly, and thereby limit or eliminate the electromagnetic, inductive or/and capacitive couplings, between the excitation and detection windings. According to another variant, the magnetic circuit may be formed of a branch equipped with a winding, said winding being wired to a Wheatstone bridge comprising for example three fixed impedances, one of said impedances having the same value as the winding when the magnetic circuit is not saturated.

A pulse generator or pulse generating means 120 are provided at the input of the magnetic circuit 101, and connected for example to an end of the first excitation winding 104 and to an end of the second excitation winding 106. The pulse generator 120 is provided to deliver an excitation signal $S_1$ that may be in the form of a succession of short pulses of current known as "excitation" pulses, emitted at the input of the windings 104 and 106, and if necessary periodic. The pulses of the excitation signal $S_1$ have an amplitude chosen in such a way as to saturate the magnetic circuit 101 of the sensor 100. "Short pulses" is taken to mean pulses in which the duration or the width $T_1$ is very short compared to the period of the excitation signal, for example at least 50 times less than the period T of the excitation signal or at least 50000 times less than the period of the excitation signal. The pulse generator 120 is employed to generate pulses of a duration or width $T_1$, provided sufficiently big so that a signal noted $S_2$ at the output of the sensor, may be exploited by the detection means.

The pulses of the excitation signal $S_1$ may have for example a duration or a width at least greater than 10 nanoseconds or/and at least less than 30 nanoseconds. The pulses of the excitation signal $S_1$ may have a duration or a width chosen preferably between 10 and 30 nanoseconds particularly for a sensor in which the thickness of the core or the magnetic circuit is around 1 µm to several micrometers and the length of which is around 100 µm to several hundreds of micrometers. This time interval is chosen as a function of the time constant of the circuit.

For a frequency of pulses of the excitation signal $S_1$ around 50 kHz, the duration of the pulses may be chosen for example one hundred times smaller than the period of the excitation signal, for example around 20 nanoseconds. The current consumed may thereby be 100 times less than the amplitude of the pulse.

The pulses of the excitation signal $S_1$ may have a rectangular or substantially rectangular shape. "Substantially" rectangular shape is taken to mean the pulses comprise fronts of duration for example around 2 nanoseconds, or for example between 1 nanosecond and 5 nanoseconds.

Compared to triangular or sinusoidal signals employed in devices according to the prior art, the excitation signal $S_1$ formed of a succession of pulses makes it possible in particular to obtain a reduced consumption. The cyclic ratio and the frequency of the excitation signal $S_1$ generated by the means 120, may be modulated, for example in a ratio from 1 to 10000. Means for modulating the frequency of the excitation signal may be provided.

The frequency of the excitation signal $S_1$ may be for example between 100 Hz and 1 MHz and chosen as a function of the type of detection that the sensor 100 is intended to carry out.

A low excitation frequency, for example between 100 Hz and 1 kHz, may be chosen for example for applications of the sensor that require a low consumption, for example at least inferior to 100 µA under an excitation voltage of amplitude for example around 3 volts, but do not necessitate a significant bandwidth, for example of around or less than 1/10 of the frequency of the excitation signal, i.e. between 10 Hz and 100 Hz.

An excitation frequency between 50 kHz and 500 kHz may be chosen for example for applications that require a bandwidth of around or at least 10 kHz as well as a noise no higher than 5 $nT/Hz^{1/2}$.

According to one possibility, the excitation signal $S_1$ may be in the form of an alternation of positive pulses 125 and negative pulses 126 or be formed of at least two successive pulses of opposite signs. In this way, the useful component of the signal $S_2$ at the output of the sensor 100 has a sign independent of that of the pulses emitted at the input of the sensor 100, whereas any parasitic couplings between the excitation and detection windings cancel each other out. The negative pulses 126 and positive pulses 125 may have equal respective widths $T_1$ or/and respective amplitudes A. Said positive 125 and negative 126 pulses may thus be symmetrical. An excitation signal $S_1$ employed with symmetric pulses can make it possible to reduce or eliminate offsets in the signal $S_2$ at the output of the magnetic sensor.

According to one possibility, the excitation signal $S_1$ may be employed for a square or rectangular signal to which one has applied a high pass filtering. The excitation signal $S_1$ may if necessary be employed by a CMOS (complementary metal oxide semiconductor) circuit.

Sampling means 130 are provided, to carry out, in particular, acquisitions of the signal $S_2$ at the output of the sensor 100, as a function of a sampling control signal $S_3$ and in particular variations in a sampling control signal $S_3$ or the state of a sampling control signal $S_3$ delivered at the input of the sampling means 130. The variations in the control signal $S_3$ are themselves dependent, or the state of the control signal $S_3$ is itself dependent, on variations in the excitation signal $S_1$.

Means are employed, following the emission or the production of a pulse in the excitation signal $S_1$, to modify at least once the sampling control signal $S_3$ or the state of the sampling control signal $S_3$, so as to trigger at least one acquisition of the output signal $S_2$ of the sensor 100 during the duration of this excitation pulse. In other words, the measuring device is provided so that the sampling means 130 carry out an acquisition of the signal $S_2$ at the output of the sensor or the magnetic circuit at instants situated during the respective durations of the pulses of the excitation signal $S_1$. According to a specific embodiment, means may be employed to trigger at least one acquisition of the signal at the output of the sensor or the magnetic circuit, following each of the excitation pulses emitted, during the respective durations of these pulses. The sampling control signal $S_3$ may be formed and delivered by the pulse generating means 120. The sampling control signal $S_3$ may be for example a signal with two states, as illustrated in FIG. 4.

The sampling means 130 produce at the output a signal $S_4$ representative of a measured magnetic field. The signal $S_4$ at the output of the sampling means may be for example an analog voltage or, if necessary, a digital signal, for example a numeric word. The sampling means 130 may comprise for example means forming a sampler-blocker. According to a variant, the sampling means 130 may comprise means forming an analog-digital converter.

At the output of the sampling means 130, a stage 140 comprising means of low pass filtering and/or means of low frequency amplification may be provided. This stage 140 delivers an output signal $S_5$.

With such a device, one obtains a signal $S_2$ at the output of the high amplitude sensor, for example around 30 mV for a magnetic field to be measured of around 30 µT, which makes it possible to protect against an amplifier between the output of the magnetic sensor and the sampling means 130, and in particular a high frequency amplifier. The employment of low frequency amplification means after the sampling means 130, rather than a high frequency amplifier before the sampling means 130, may make it possible in particular to reduce the consumption of the measuring device.

Figure 5A:
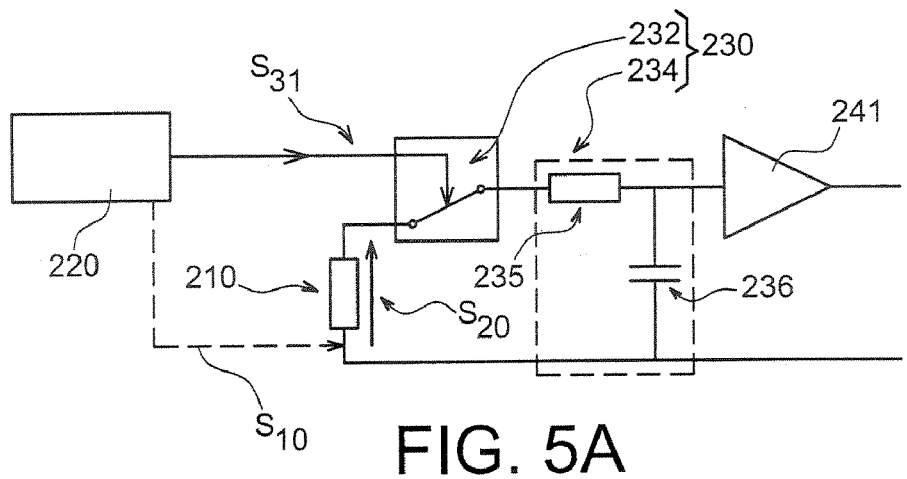
FIGS. 5A and 5B, illustrate respectively:
  a first example of embodiment of a magnetic field measuring device according to the invention, comprising a fluxgate magnetometer type sensor and improved sampling means at the output of the sensor,
  excitations signals from the magnetic sensor and control of said sampling means, employed within such a device.

A variant of the electronic detection or/and measuring device according to the invention previously described, equipped with a fluxgate magnetometer type sensor 210 is illustrated in FIG. 5A.

Generating means 220 deliver an excitation signal $S_{10}$ to a sensor or magnetic circuit 210. The excitation signal $S_{10}$ may be of the type of that $S_1$ described previously. At the output of the sensor or magnetic circuit 210, are provided sampling means 230 capable of carrying out, at least one acquisition of a signal $S_{20}$ at the output of the sensor 210 during each of the pulses of the excitation signal $S_{10}$. According to this variant, the sampling means 230 may be equipped with means forming a switch, for example an analog switch 232, the opening and the closing of which are controlled by a sampling control signal $S_{31}$ also generated by the excitation signal $S_{10}$ generating means 220. The variations in the control signal $S_{31}$ are dependent on those of the excitation signal $S_{10}$. The sampling means 230 further comprise means forming a low pass filter 234. The means forming a low pass filter 234 may be in the form for example of means forming a resistor 235 combined with means forming a capacitor 236. An amplifier 241 may be provided at the output of the filter 234. The amplifier 241 is equipped with a high input impedance, for example greater than 10 MΩ, so as to conserve a constant signal at the output of the sampling means 230, when the switch 232 is open. The time constant of the capacitor 236 and the input resistance of the amplifier is preferably much greater than the largest period of the excitation pulses, for example between 5 and 10 times greater.

The amplifier 241 may be for example arranged according to a follower assembly. The sampling means 230 deliver a signal representative of the magnetic field to be measured, for example in the form of an analog voltage.

Figure 5B:
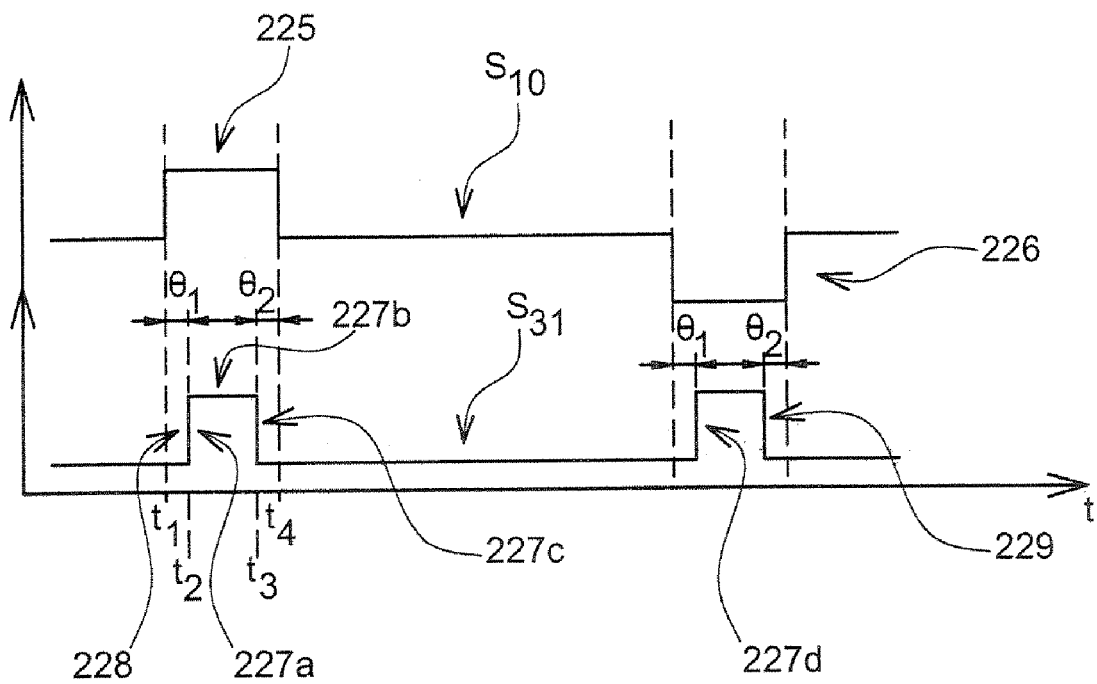

In FIG. 5B, are illustrated curves representative respectively, of the sampling control signal $S_{31}$ for example in the form of a signal with two states, and the excitation signal $S_{10}$ emitted at the input of the sensor 210. The excitation signal $S_{10}$ is formed of a succession of pulses 225, 226, alternatively of opposite signs, for example positive then negative. Following the emission or the production of a first pulse 225 in the excitation signal $S_1$ at an instant $t_1$, the sampling control signal $S_{31}$ is modified or caused to change state, after a predetermined time interval $\theta_1$ or a predetermined time or time frame $\theta_1$ and passes from a first state to a second state, for example from the low state to the high state (portion referenced 227a in FIG. 5B), so as to close the switch 232 and trigger an acquisition of the signal at the output of the sensor by the sampling means 230. For this embodiment variant, the acquisition of the signal $S_{20}$ at the output of the sensor 210 is carried out for the duration of the first excitation pulse, a predetermined time frame $\theta_1$ after the start of this first pulse. In this way, one does not carry out detection at the moment when the excitation pulse 225 is emitted or at the start of this excitation pulse 225, in other words at a moment during which electromagnetic parasite electromagnetic coupling or noise phenomena in the signal $S_{20}$ are likely to arise.

The control signal $S_{31}$ is maintained in the second state for a predetermined duration between an instant $t_2$ and an instant $t_3$ (portion referenced 227b in FIG. 5B), so as to maintain the switch closed for this predetermined duration. In other words, the acquisition of the signal at the output of the sensor carried out for the duration of the first excitation pulse 225, is carried out between the instant $t_2$ and the instant $t_3$. Then, a predetermined time or a time frame $\theta_2$ before the end of the first excitation pulse 225, the sampling control signal $S_{31}$ is modified or caused to chance state, and passes from the second state to the first state, for example from the high state to the low state (portion referenced 227c in FIG. 5B), so as to open the switch 232. An averaging or smoothing out of the voltage induced at the output of the sensor 210 is also carried out during said duration of the pulse 225, between the instant $t_2$ and the instant $t_3$. The duration of the first pulse 225 ends at an instant $t_4$. The change of state of the control signal, provided at a time frame $\theta_2$ before $t_4$, makes it possible not to carry out a detection at the moment when the pulse 225 ends or at the end of the excitation pulse 225, in other words at a moment during which parasite coupling or noise phenomena in the signal $S_{30}$ can arise. A signal known as "smoothed out" is formed by smoothing out of the output signal $S_{20}$ of the sensor 210.

Then, a second pulse 226 for example of negative sign is emitted. The control signal $S_{31}$ is modified or caused to change state (portion referenced 227d), a predetermined time frame $\theta_1$ after the start of the second pulse. Then, a predetermined time frame $\theta_2$ before the end of the second pulse 226, the sampling control signal $S_{21}$ is modified or caused to change state, and passes from the second state to the first state, for example from the high state to the low state, so as to open the switch 232.

Between the pulses 225 and 226 the switch is now open, and the smoothed out signal at the output of the sampling means 230 is memorised. The sampling means 230 are provided to memorise said "smoothed out" signal, up to the second excitation pulse 226.

Figure 6A:
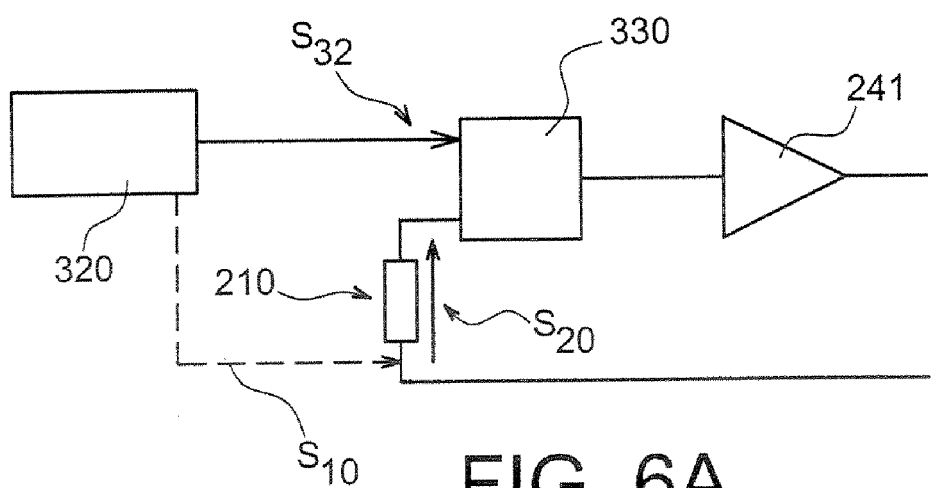
FIGS. 6A and 6B, illustrate respectively:
  a second embodiment of a magnetic field measuring device according to the invention comprising a fluxgate magnetometer type sensor and improved sampling means at the output of the sensor,
  excitations signals from the magnetic sensor and control of said sampling means, employed within such a device.

A second variant of electronic detection or/and measuring device according to the invention equipped with a fluxgate magnetometer type sensor 210, is illustrated in FIG. 6A. According to this variant, at the cutout of the sensor or magnetic circuit 210, are provided sampling means equipped with a sampler-blocker 330. The sampler-blocker 330 delivers a signal representative of the magnetic field to be measured, for example in the form of a voltage. Generating means 320 deliver an excitation signal $S_{10}$, to the magnetic sensor 210. At the output of the sensor 210, the sampling means 330 are employed to carry out, following a pulse of the excitation signal $S_{10}$, an acquisition of a signal $S_{20}$ at the output of the sensor 210 for the duration of this pulse. According to this variant, the sampling means 330 are controlled by a sampling control signal $S_{32}$ generated by the means 320 for generating the excitation signal $S_{10}$. The variations in the control signal $S_{32}$ are dependent on those of the excitation signal $S_{10}$.

Figure 6B:
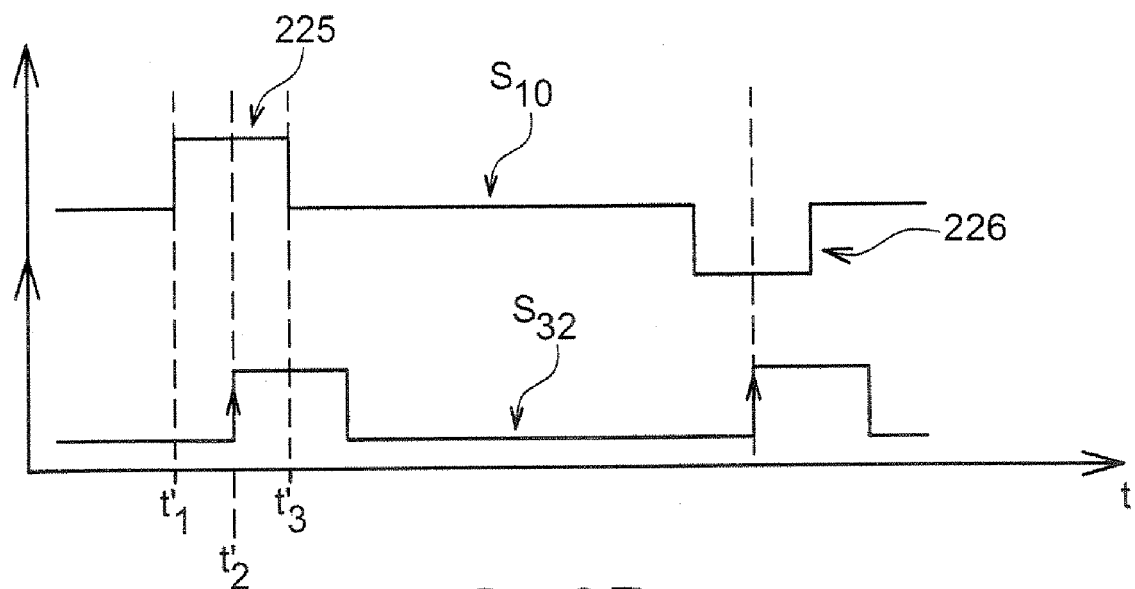

In FIG. 6B are illustrated curves representative respectively, of the sampling control signal $S_{32}$, for example in the form of a signal with two states, emitted at the input of the sampler-blocker 330 and the excitation signal $S_{10}$, for example in the form of a current, emitted at the input of the sensor 210. The excitation signal $S_{10}$ is formed of a succession of pulses 225, 226, alternatively positive then negative. Following the emission or the production of a first pulse 225 in the excitation signal $S_{10}$ at an instant $t'_1$, the sampling control signal $S_{32}$ is caused to change state and passes from a first state to a second state, for example from the low state to the high state, at an instant $t'_2$ situated during the duration of the pulse 225. The pulse generating means 320 are, in this example, employed so that the instant $t'_2$ of change of state of the control signal $S_{32}$ is situated in the middle of the excitation pulse 225. The change of state of the control signal $S_{22}$ at the instant $t'_2$ provokes an acquisition, by the sampler-blocker 330, of the signal at the output of the sensor. At the instant $t'_2$, the sampler-blocker 330 memorises the signal at the output of the sensor. Carrying out an acquisition of the signal $S_{20}$, at an instant situated for example in the middle of the pulse 225, may make it possible to obtain a signal that does not include parasite noise due to electromagnetic coupling phenomena during transitions or changes of states of the excitation signal.

Figure 7A:
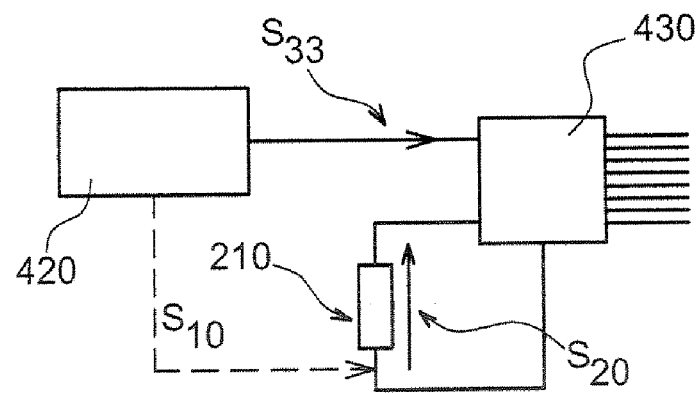
FIGS. 7A and 7B, illustrate respectively:
  a third embodiment of a magnetic field measuring device according to the invention comprising a fluxgate magnetometer type sensor and improved sampling means at the output of the sensor,
  and excitations signals from the magnetic sensor and control of said sampling means, employed within such a device.

A third variant of electronic detection or/and measuring device according to the invention, equipped with a fluxgate magnetometer type sensor 210, is illustrated in FIG. 7A. According to this variant, at the output of the sensor or magnetic circuit 210, are provided sampling means comprising an analog to digital converter 430. The converter 430 delivers a signal representative of the magnetic field to be measured, for example in the form of a numeric word.

Figure 7B:
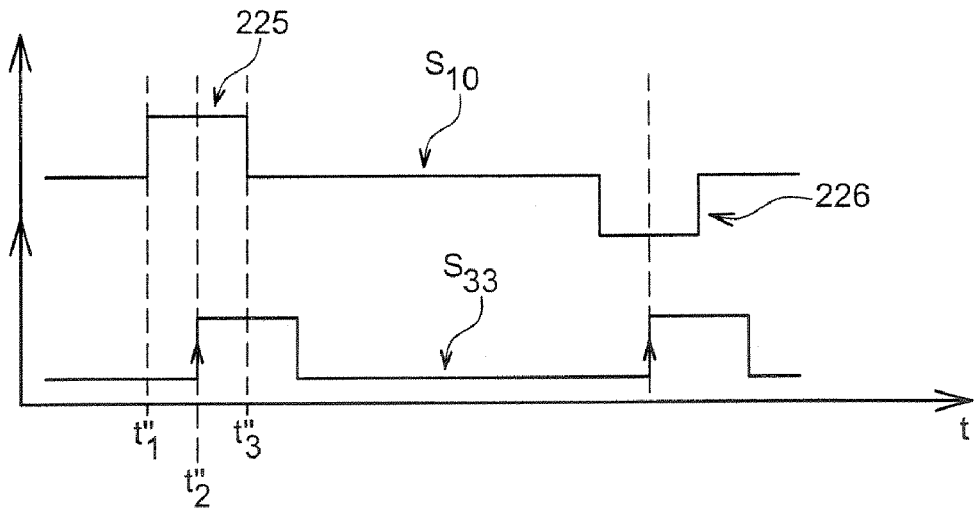

In FIG. 7B are illustrated curves representative respectively, of a sampling control signal $S_{33}$ for example in the form of a signal with two states, emitted at the input of the converter 430 and an excitation signal $S_{10}$, as described previously, emitted at the input of the sensor 210. The excitation signal $S_{10}$ is formed of a succession of pulses 225, 226, alternately positive then negative. Following the emission or the production of a first pulse 225 in the excitation signal $S_{10}$ at an instant $t''_1$, the sampling control signal $S_{33}$ passes from a first state to a second state, for example from the low state to the high state, at an instant $t''_2$ situated during the duration of the pulse 225 between the instant $t''_1$ and an instant $t''_3$ referenced in FIG. 7B, the instant $t''_2$ of chance of state of the control signal $S_{33}$ may be provided to be situated in the middle of the excitation pulse 225. The change of state of the control signal $S_{33}$ at the instant $t''_2$ provokes in particular an acquisition, by the converter 430, of the signal $S_{20}$ at the output of the sensor 210, as well as a conversion of this signal. Carrying out a conversion of the signal $S_{20}$, at an instant situated in the middle of the pulse 225, may make it possible to obtain a signal in which noise parasite phenomena due in particular to coupling during transitions or changes of states of the excitation signal, are minimised.

Figure 8:
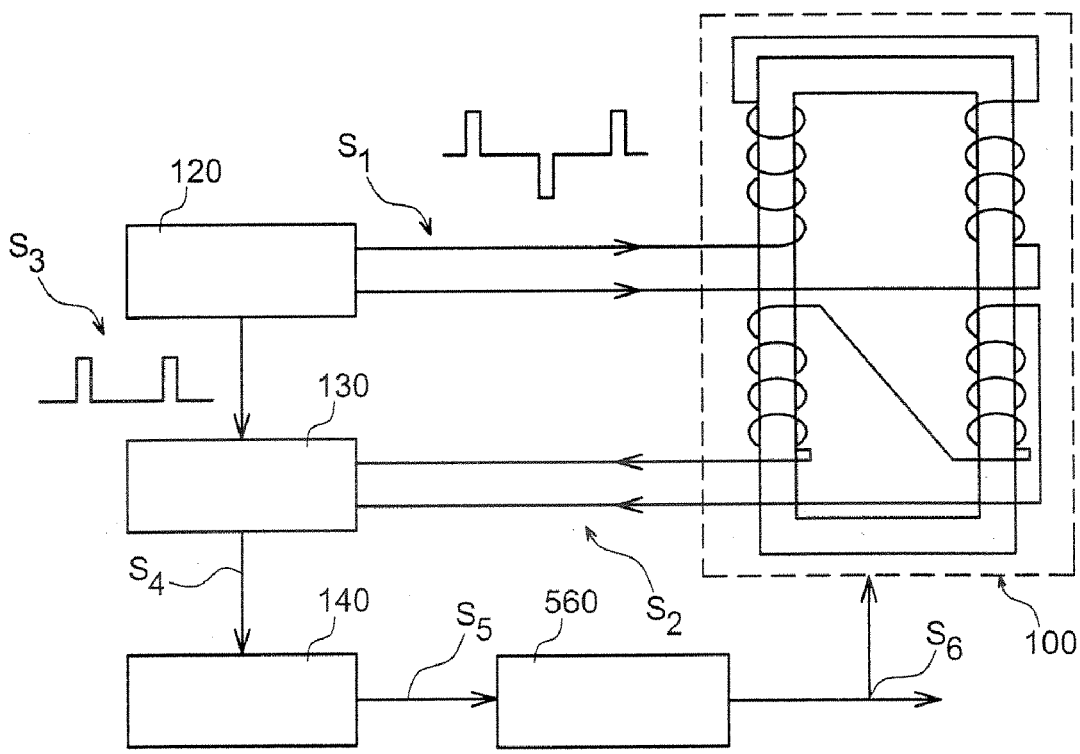
FIG. 8 illustrates an example of slaved operating magnetic field measuring device according to the invention.

A variant of the example of electronic detection or/and measuring device according to the invention given previously in relation to FIG. 4, is illustrated in FIG. 8. For this variant, the measuring device is capable of having a slaved operating and comprises a servo or feedback loop. A signal representative of a measured magnetic field, for example the output signal $S_5$ of the amplifier 140 or (according to one possibility not represented) the numeric word at the output of an analog to digital converter (such as the converter referenced 430 in FIG. 7A) plays the role of an error signal of the servo loop. This error signal is applied at the input of the means forming an integrator 560, for example an amplifier integrator or a digital integrator. At the output of the integrator 560 a signal $S_6$ known as "feedback" signal, intended to feed one or several feedback windings is delivered. The "feedback" windings may be, one or several excitation windings 104, 106 or one or several specific supplementary windings (not represented). The application of a feedback signal $S_6$ to the feedback windings makes it possible to form a feedback magnetic field that opposes the magnetic field in which the sensor 100 is bathed. In this example, the magnetic sensor 100 operates under a magnetic field, the average value of which is zero. The measuring dynamic and the linearity of the measuring device may thereby be improved.

Figure 9:
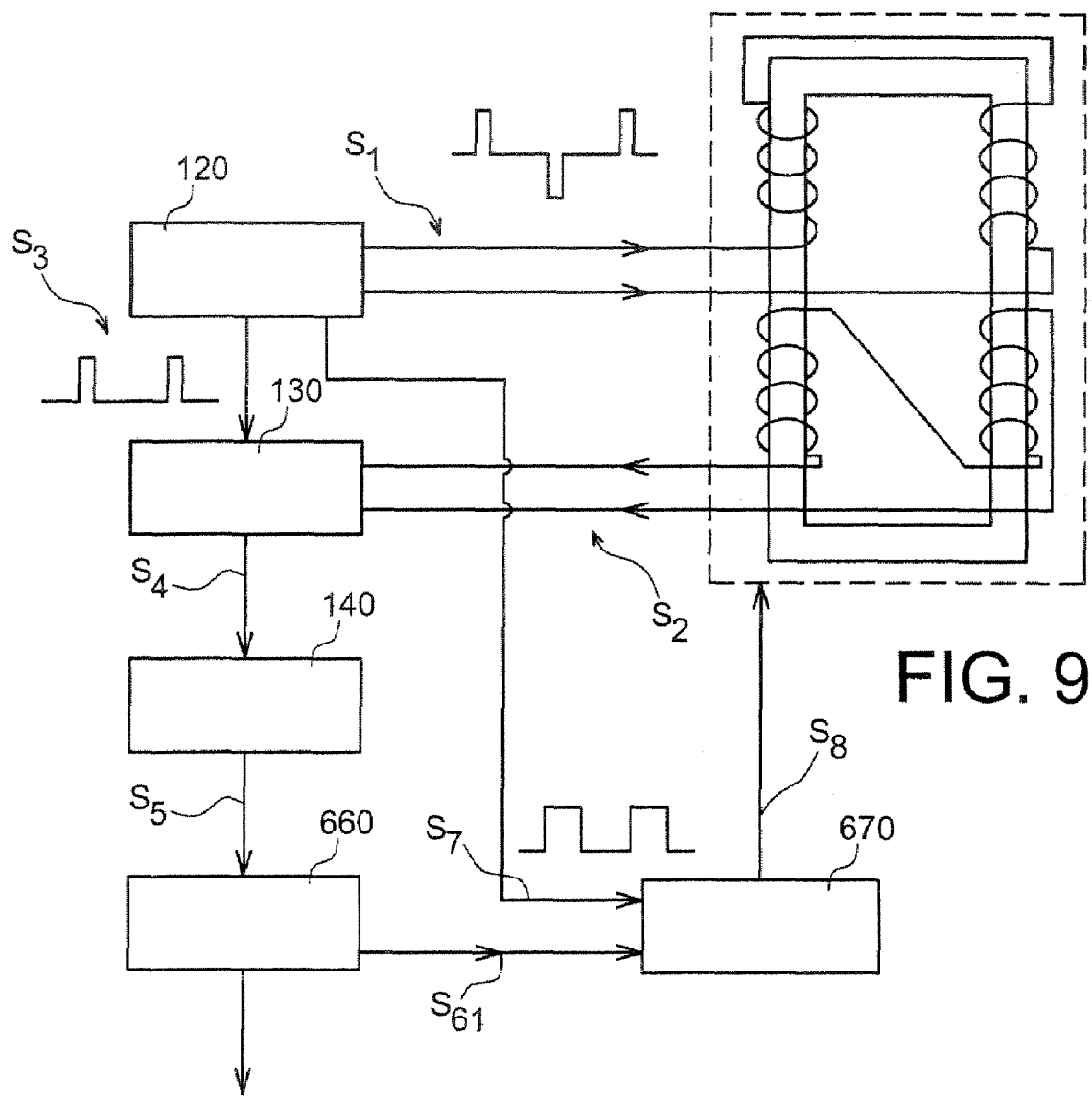
FIGS. 9 and 10 illustrate respectively:
  another example of slaved operating magnetic field measuring device according to the invention and equipped with means for generating a feedback signal, said feedback signal being delivered by means controlled by a "pulsed" control signal,
  a chronogram of the operation of this example of device.

A specific embodiment of the slaved operating magnetic field measuring device and with feedback known as "pulsed", is illustrated in FIG. 9. In this example, means for applying a feedback signal $S_8$ to the magnetic sensor 100, are controlled by a feedback control signal $S_7$ formed of a succession of pulses. The device thus moreover comprises, control means 670 capable of delivering the feedback signal $S_8$, and controlled by the feedback control signal $S_7$. This feedback control signal $S_7$, may be for example a logic signal, delivered by the pulse generator 120. In this example, the feedback loop comprises means 660 forming at least one integrator, situated at the output of the amplifier and filtering stage 140. Means for memorising an information relative to the amplitude of the feedback signal between two excitation pulses may also be provided. According to one possible embodiment, these memorisation means may belong to the integrator 660. The feedback control means 670 receive at the input the output signal $S_{61}$ of the integrator 660 and are capable, as a function of the state of the feedback control signal $S_7$, to emit or not, a feedback signal $S_8$, the amplitude of which depends on that of the output signal $S_{61}$.

Figure 10:
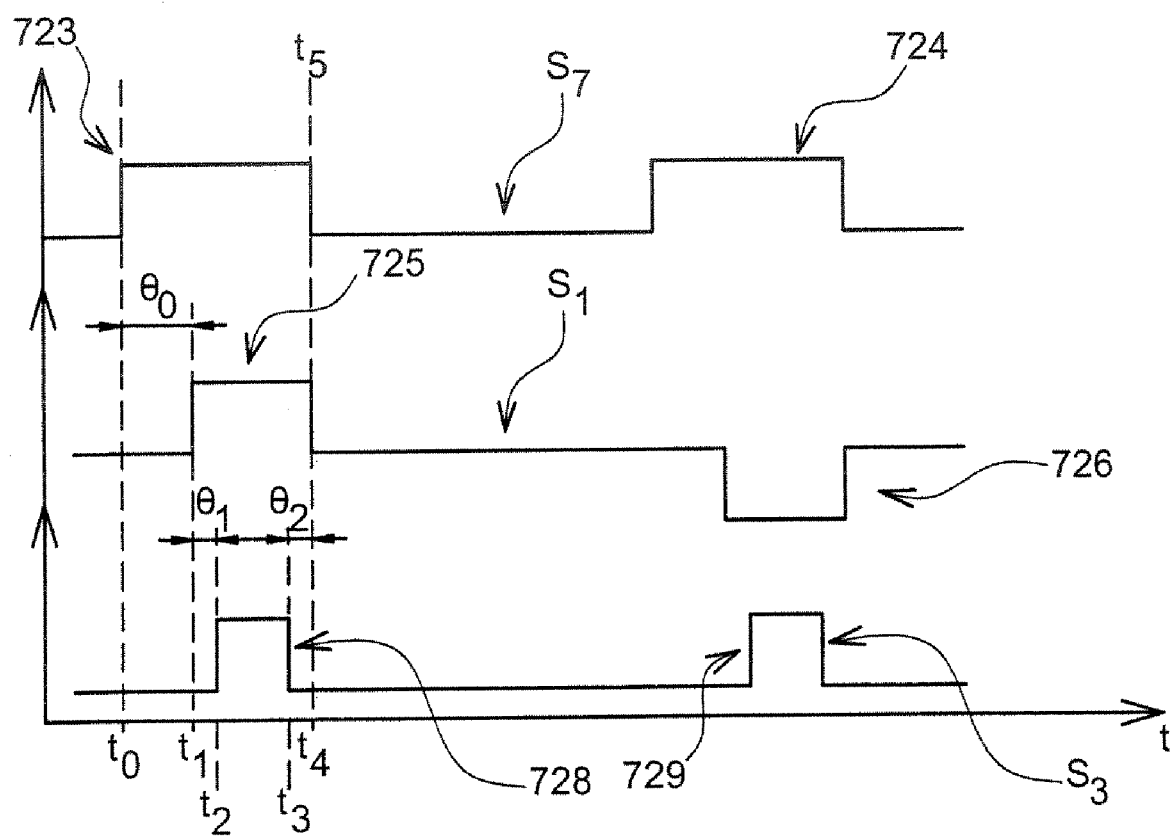

An operation of the pulsed feedback device is now going to be given in relation to the chronogram of FIG. 10, in which curves representative of a feedback control signal $S_7$, an excitation signal $S_1$, and a sampling control signal $S_3$ are given. The signals $S_1$, $S_3$, $S_7$ may be formed by the pulse generator 120 and formed respectively, of a first succession of pulses 723, 724 of a second succession of pulses 725; 726, and of a third succession of pulses 728, 729. The variations in the excitation signal $S_1$, are dependent on those of the feedback control signal $S_7$, whereas the variations in the sampling control signal $S_3$ are dependant on those of the excitation signal $S_1$.

As of an instant $t_0$, the feedback control signal $S_7$ changes state. A feedback signal $S_8$ (not represented in this figure), the amplitude of which has been defined and memorised by the integrator 660 during a previous sampling, is then applied to the feedback windings of the sensor 100 as of the instant $t_0$.

Then, after a predetermined time frame $\theta_0$, an excitation pulse 725 is emitted at an instant $t_1$. The predetermined time frame $\theta_0$ is provided so as to enable the establishment of a feedback magnetic field at a precise value, and may be for example such that $\theta_0 = 5\tau$ where $\tau$ is the time constant of the magnetic circuit of the sensor 100.

Then, a predetermined time frame $\theta_1$ after the instant $t_1$, the output signal $S_2$ of the detection windings 108, 110, is sampled by the sampling means 130, amplified by the means 140 and applied at the input of the integrator 660. The integrator 660 corrects if necessary the feedback signal in order to tend to cancel the output signal $S_2$ from the detection windings 108, 110. A new value of the feedback signal is memorised up to the following sample.

Then, the sampling of the output signal $S_2$ of the detection windings is interrupted at an instant $t_3$. The excitation pulse then ends at an instant $t_4$, a predetermined time frame $\theta_2$ after the instant $t_3$. The feedback control pulse then ends at an instant $t_5$. As of the instant $t_5$ and up to a following sample, the feedback is stopped.

After several samples enabling the stabilisation of the servo loop, the value of the feedback signal memorised is the image of the magnetic field in which the magnetic sensor is bathed and that one wishes to measure.

In this example of embodiment, the pulses 728, 729 of the sampling control signal $S_3$ are situated respectively during the respective durations of the pulses of the excitation signal $S_1$, the excitation pulses 725, 726 being themselves respectively situated during the durations of the pulses 723, 724, of the feedback control signal $S_7$.

Figure 11:
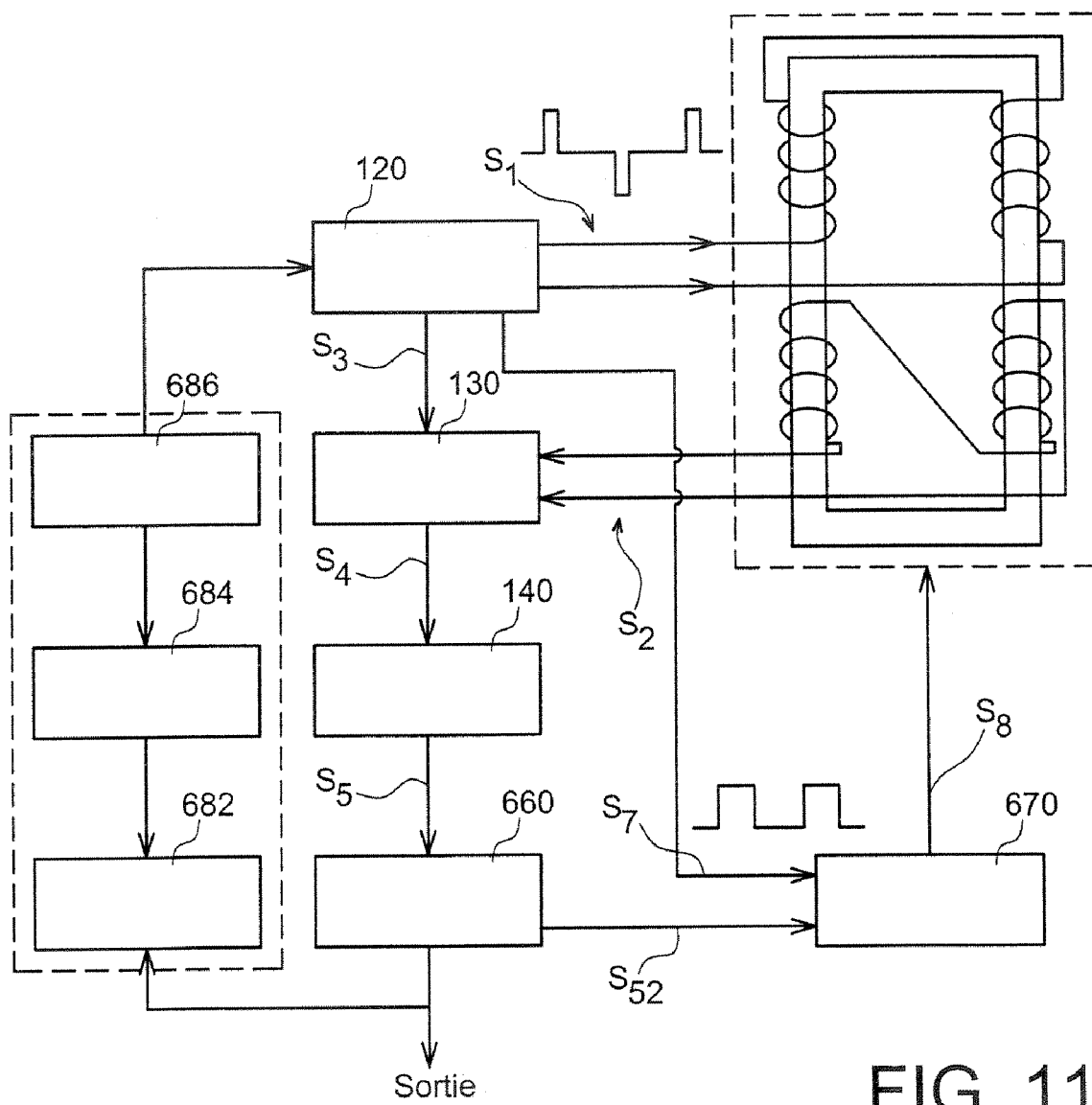
FIG. 11 illustrates another example of slaved operating magnetic field measuring device according to the invention and equipped with means to modulate the frequency of repetition of the pulses emitted towards the magnetic circuit as a function of the rate of variation in the magnetic field in which the magnetic sensor is bathed.

A variant of the previous example of device, with slaved operating, will now be given in relation to figure 11. For this variant, the device has an operation known as "self-adapting". "Self-adapting" is taken to mean that the frequency of repetition of the excitation pulses emitted by the generating means 120 may be adjusted in an automatic manner within the device, as a function of the rate or rapidity of variation in the magnetic field to be measured surrounding the sensor 100. In this embodiment, means are thus employed to modulate the frequency of repetition of the excitation pulses of the signal $S_1$ delivered by the generating means 120, as a function of the rate of variation or rapidity of variation in the magnetic field to be measured surrounding the sensor 100. These modulation means may comprise for example means 682 forming a differentiator, connected to an output of the integrator 660, means 684 forming a rectifier without threshold, connected to an output of the means forming a differentiator 682, as well as means 686 forming a voltage controlled oscillator, connected to an output of the means forming a rectifier 684, the means 686 forming an oscillator being connected to the pulse generating means 120.

Such a device may be provided for example so that, when the surrounding magnetic field is constant or varies slowly, the frequency of repetition of the excitation pulses is low, whereas when the magnetic field varies rapidly, the frequency of repetition of the excitation pulses is high. Such a mode of operation may enable the consumption to be optimised.

A compass device comprising such a type of self-adapting and slaved operating magnetic field measuring device, may be employed according to the invention and provided for example so that the frequency of the magnetic field measurements varies according to whether the compass is immobile or in movement.

The operation of the compass device employed according to the invention may be as follows: when the sensor 100 is immobile, the magnetic field to be measured is constant or substantially constant and the output signal is also constant. The signal at the output of the differentiator 682 is then zero, the signal at the output of the rectifier without threshold 684 is zero and the frequency of repetition of the excitation pulses is minimal, for example around 100 Hz. When the sensor 100 is brought into movement, the magnetic field is variable, and the output signal is also variable. The signal at the output of the differentiator 682 is then not zero, whereas the signal at the output of the rectifier without threshold 684 is positive and the frequency of repetition of the excitation pulses is high, for example around 100 kHz. Thus, the bandwidth is low when the magnetic field varies little, and high when the magnetic field varies rapidly. Such a compass device, may be equipped with two sensors of the type of sensor 100, positioned at 90°, and employed so that the direction of north is calculated as a function of the output signal $S_4$ of each of these two sensors.

Figure 12:
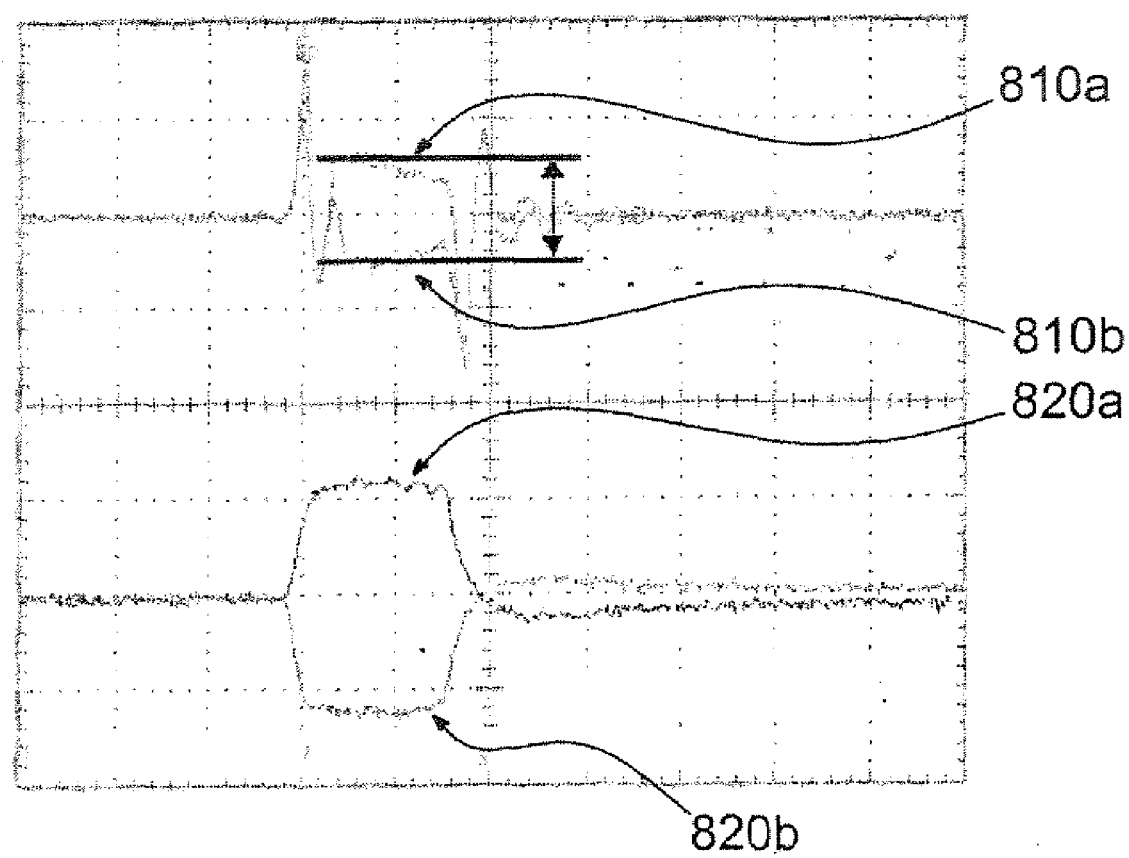
FIG. 12 illustrates measurement signals obtained by means of an example of device employed according to the invention.

FIG. 12 illustrates measuring signals 810a and 810b known as "useful signals" obtained by means of the devices previously described and in response to respectively a first excitation pulse 820a and a second excitation pulse stemming from the pulse generating means 120, and shows that a "sampled" detection employed according to the invention may enable the peak to peak amplitude of the measuring signal to be exploited.

The invention claimed is:

1. A magnetic field measuring device, equipped with a fluxgate magnetometer, the device comprising:
   a magnetic sensor equipped with at least one magnetic core and a plurality of windings, and configured to deliver at least one output signal;
   pulse generating means for emitting at least one excitation signal at the input of the magnetic sensor, in the form of a succession of excitation pulses, one excitation pulse of said excitation pulses having a duration at least 50 times less than a period of said at least one excitation signal;
   sampling means for sampling the output signal of the magnetic sensor; and means for, following the emission of at least one excitation pulse of said succession of excitation pulses and during the duration of said at least one excitation pulse, triggering at least one acquisition of the output signal of the magnetic sensor by said sampling means.

2. The device according to claim 1, the excitation signal formed of successive excitation pulses of opposite signs.

3. The device according to claim 1 or 2, said excitation pulses having equal respective durations or/and respective amplitudes.

4. The device according to claim 3, said excitation pulses having a rectangular shape.

5. The device according to claim 1, in which the sampling means are controlled by at least one sampling control signal with two states, generated by the pulse generating means.

6. The device according to claim 1, the sampling means configured to, following said emission of said excitation pulse, carry out at least one acquisition of the signal at the output of the magnetic sensor during a given time interval less than the duration of said excitation pulse, said time interval between an instant situated at a first predetermined time frame after, the start of said excitation pulse and an instant situated at a second predetermined time frame before the end of said excitation pulse.

7. The device according to claim 6, the sampling means configured to carry out an averaging or a smoothing out of the output signal of the magnetic sensor during said given time interval.

8. The device according to claim 7, in which a smoothed out signal is formed following said averaging or said smoothing out of said output signal, the sampling means configured to memorize said smoothed out signal, after said given time interval and up to at least one other excitation pulse of said succession of excitation pulses.

9. The device according to claim 6, the sampling means further comprising means for forming an analog switch.

10. The device according to claim 9, the sampling means further comprising means for forming a low pass filter.

11. The device according to claim 1, the sampling means configured, following said emission of said excitation pulse, to carry out at least one acquisition of the output signal of the sensor at a given predetermined instant situated after the start and before the end of said excitation pulse.

12. The device according to claim 11, said given predetermined instant situated in the middle of said excitation pulse.

13. The device according to claim 11, the sampling means configured to carry out a memorisation of the output signal of the sensor at said given predetermined instant.

14. The device according to claim 11, the sampling means further comprising at least one sampler-blocker.

15. The device according to claim 12 or 13, the sampling means configured to carry out an analog to digital conversion of the output signal of the sensor at said given predetermined instant.

16. The device according to claim 1, in which the device is configured to adopt a slaved operating and further comprises one or several feedback windings, and a feedback loop equipped with means for producing a feedback signal intended for said feedback windings.

17. The device according to claim 16, said means for producing a feedback signal further comprising means for forming at least one integrator.

18. The device according to claim 16 or 17, said means for producing a feedback signal further comprising means for memorising an information relative to the amplitude of said feedback signal, between two excitation pulses.

19. The device according to claim 16, in which the means for producing a feedback signal are controlled by at least one feedback control signal generated by the pulse generating means in the form of a succession of feedback control pulses.

20. The device according to claim 1, in which said magnetic sensor is bathed in a magnetic field, the device further comprising: means for, following a variation in the magnetic field according to a given rapidity in which the magnetic sensor is bathed, modulating the frequency of repetition of said pulses of the excitation signal as a function of said given rapidity.

21. A magnetic field measuring method using a device equipped with a fluxgate magnetometer, the device including:

a magnetic sensor, equipped with at least one magnetic core and a plurality of windings, and configured to deliver at least one output signal, means for exciting the magnetic core, including pulse generating means configured to emit at least one excitation signal at the input of the magnetic sensor in the form of a succession of excitation pulses, one excitation pulse of said excitation pulses having a duration at least 50 times less than a period of said excitation signal, and sampling means for sampling the output signal of the magnetic sensor, the method comprising:

a) emitting at least one excitation pulse at the input of the magnetic sensor; and b) triggering, following said emission of said excitation pulse, at least one acquisition of the output signal of the magnetic sensor by the sampling means during the duration of said excitation pulse.

22. The method according to claim 21, the excitation signal formed of several successive excitation pulses of respective opposite signs.

23. The method according to claim 21 or 22, said excitation pulses having equal respective durations or/and respective amplitudes.

24. The method according to claim 23, said excitation pulses having a rectangular shape.

25. The method according to claim 21, in which the sampling means are controlled by at least one control signal with two states, generated by the pulse generating means.

26. The method according to claim 21, further comprising: acquiring, following said emission of said excitation pulse, at least once, the output signal of the sensor during a given time interval less than the duration of said excitation pulse, said time interval between an instant situated at a first predetermined time frame after the start of said pulse and an instant situated at a second predetermined time frame before the end of said given pulse.

27. The method according to claim 26, further comprising: carrying out an averaging or a smoothing out of the output signal of the magnetic sensor during said given time interval.

28. The method according to claim 27, in which a smoothed out signal is formed following said averaging or said smoothing out of the output signal, the sampling means configured to memorize said smoothed out signal, after said given time interval and up to at least one other excitation pulse of said succession of excitation pulses.

29. The method according to claim 21, further comprising:

acquiring, following said emission of said excitation pulse, at least once, the output signal of the sensor at a given predetermined instant situated after the start and before the end of said excitation pulse.

30. The method according to claim 29, said given predetermined instant situated in the middle of said excitation pulse.

31. The method according to claim 29 or 30, further comprising: memorizing the output signal of the sensor at said given predetermined instant.

32. The method according to claim 29 or 30, further comprising:

converting the output signal of the sensor from analog to digital at said given predetermined instant.

33. The method according to claim 21, in which the device further comprises: one or several feedback windings, and a feedback loop equipped with means for producing a feedback signal intended for said feedback windings, the means for producing said feedback signal are controlled by at least one feedback control signal generated by the pulse generating means in the form of a succession of feedback control pulses, said excitation pulse emitted at the step a) triggered following an emission by the pulse generating means of a feedback control pulse.

34. The method according to claim 33, a) and b) taking place during the duration of said feedback control pulse.

35. The method according to claim 21, further comprising:

modulating, following a variation according to a given rapidity of variation in the magnetic field in which the magnetic sensor is bathed, the frequency of repetition of said excitation pulses of the excitation signal as a function of the given rapidity of variation.

* * * * *